(12) United States Patent
Oono et al.

(10) Patent No.: US 6,246,282 B1
(45) Date of Patent: Jun. 12, 2001

(54) FIRST STAGE AMPLIFIER CIRCUIT

(75) Inventors: Hiroshi Oono, Tokyo; Masaaki Yokomizo, Kanagawa, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/433,288

(22) Filed: Nov. 3, 1999

(30) Foreign Application Priority Data

Nov. 5, 1998 (JP) .................................................. 10-314233

(51) Int. Cl.⁷ ...................................................... H03F 1/36

(52) U.S. Cl. ......................... 330/86; 330/308; 250/214 A

(58) Field of Search .............................. 330/86, 110, 282, 330/308; 250/214 A, 214 AG

(56) References Cited

U.S. PATENT DOCUMENTS

| | | | |
|---|---|---|---|
| 5,946,608 | * 8/1999 | Morita et al. | 455/334 |
| 5,952,883 | * 9/1999 | Masuta | 330/279 |
| 5,952,887 | * 9/1999 | Katayanagi et al. | 330/308 |
| 6,084,478 | * 7/2000 | Mayampurath | 330/308 |
| 6,114,686 | * 9/2000 | Funahashi | 250/214 A |

FOREIGN PATENT DOCUMENTS 7-38342   2/1995 (JP) .

* cited by examiner

Primary Examiner—Robert Pascal
Assistant Examiner—Henry Choe
(74) Attorney, Agent, or Firm—McGinn & Gibb, PLLC

(57) ABSTRACT

A first stage amplifier circuit includes an amplifier, a variable feedback resistance, a comparator and a shift register. The amplifier amplifies an input signal supplied thereto. The variable feedback resistance includes two or more feedback resistors and one or more switches for changing the connection of the feedback resistors and thereby changing the composite resistance of the feedback resistors. The variable feedback resistance is connected between the output terminal and the input terminal of the amplifier. The comparator judges whether or not the output signal of the amplifier exceeds a predetermined threshold value. The shift register has one or more stages corresponding to the switches of the variable feedback resistance. The shift register operates the switches of the variable feedback resistance one by one and successively reduces the composite resistance of the variable feedback resistance as long as the output signal of the amplifier is judged by the comparator to exceed the threshold value. Therefore, the gain of the amplifier is controlled adequately by the digital feedback resistance control circuit, thereby both a wide dynamic range and high speed response of the first stage amplifier circuit are realized, and thereby saturation of the amplifier is prevented and thus duty distortion of high speed signals in the amplification is eliminated.

17 Claims, 7 Drawing Sheets

F I G. 3
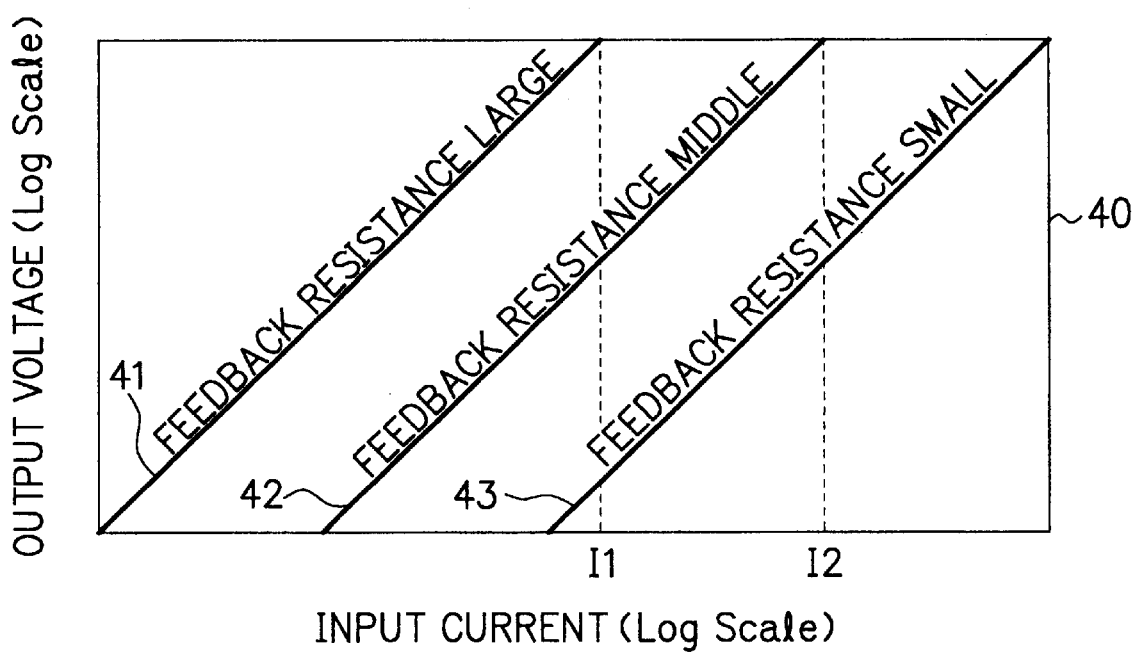

FIRST STAGE AMPLIFIER CIRCUIT

BACKGROUND OF THE INVENTION

The present invention relates to a first stage amplifier circuit, and in particular, to a first stage amplifier circuit having a wide dynamic range.

DESCRIPTION OF THE PRIOR ART

Due to rapid progress of information processing technology and optical data transmission technology of these days, both the capacity and the distance of optical data transmission are growing increasingly, and thereby optical data transmission techniques for implementing a very high data transmission bit rate are now being required. Various optical data transmission techniques have been proposed for realizing high capacity optical data transmission, and along with introduction of such techniques, high reception sensitivity is also being required of optical data reception devices. In addition to the high reception sensitivity, such optical data reception devices also requires a wide dynamic range so as to be applicable in a wide variety of circumstances, since there are cases where the optical data reception device has to receive a high level optical signal which has been transferred via a short line for intra-station data transmission, a high level optical signal transmitted by an optical amplifier for a loopback test of the station, etc. Such a wide dynamic range is especially required of the first stage amplifier circuit of the optical data reception device.

FIG. 1 is a circuit diagram showing a multistage preliminary amplifier including a conventional first stage amplifier circuit having a wide dynamic range. The multistage preliminary amplifier of FIG. 1 has three stages of amplifier circuits, including a first stage amplifier circuit 10-1, a second stage amplifier circuit 10-2, and a third stage amplifier circuit 10-3.

The output signal of the first stage amplifier circuit 10-1 is supplied to the input terminal of the second stage amplifier circuit 10-2, and the output signal of the second stage amplifier circuit 10-2 is supplied to the input terminal of the third stage amplifier circuit 10-3. The output signal of the third stage amplifier circuit 10-3 is outputted from the output terminal 11 of the multistage preliminary amplifier to outside. The output signal of the third stage amplifier circuit 10-3 is also fed back to the input terminal of the first stage amplifier circuit 10-1 via a feedback resistor 12. To the input terminal of the first stage amplifier circuit 10-1, the anode of a photodiode (PD) 13 is connected. A power source voltage Vcc is applied to the cathode of the PD 13, and thereby the PD 13 is reversely biased. Due to the reverse bias connection, when a photo (optical) signal P incidents upon the PD 13, photocurrent I occurs depending on the intensity of the photo signal P, and the photocurrent I is supplied to the input terminal of the first stage amplifier circuit 10-1. The output terminal and the input terminal of the first stage amplifier circuit 10-1 is connected via a variable impedance element 14.

The output terminal of the first stage amplifier circuit 10-1 is also connected to the input terminal of a level shift amplifier 15. The output terminal of the level shift amplifier 15 is connected to a peak detection section 16 and a signal synthesis section 17. The peak detection section 16 detects and holds the peak level of the amplified output of the level shift amplifier 15, and informs the signal synthesis section 17 of the peak level. The signal synthesis section 17 synthesizes a signal using the amplified output of the level shift amplifier 15 and the peak level informed by the peak detection section 16, and supplies the synthesized signal to the variable impedance element 14.

In the following, the operation of the conventional multistage preliminary amplifier of FIG. 1 will be described briefly. When a photo signal P (in the shape of pulses, for example) is supplied to the PD 13, photocurrent I (in the form of pulses) of an amplitude corresponding to the intensity of the photo signal P occurs, and the photocurrent I is supplied to the first stage amplifier circuit 10-1. The pulse signal from the PD 13 is successively amplified by the first stage amplifier circuit 10-5 1, the second stage amplifier circuit 10-2, and the third stage amplifier circuit 10-3. In the amplification, the gain of the first stage amplifier circuit 10-1 near the level "0" of the 1/0 pulse input signal is prevented from becoming high, in order to secure the difference between signals "0" and "1" amplified and outputted by the first stage amplifier circuit 10-1 even if the first stage amplifier circuit 10-1 is saturated by a pulse signal of a very high level. The reduction of the 0 level gain of the first stage amplifier circuit 10-1 is executed as follows. The output of the variable impedance element 14 and the output of the first stage amplifier circuit 10-1 are added together, and the added signal is slightly amplified by the level shift amplifier 15. The peak level of the slightly amplified signal is detected and held by the peak detection section 16. The signal synthesis section 17 synthesizes a signal using the slightly amplified signal from the level shift amplifier 15 and the peak level informed by the peak detection section 16, and supplies the synthesized signal to the variable impedance element 14. The resistance of the variable impedance element 14 (which changes depending on the synthesized signal supplied from the signal synthesis section 17) becomes almost 0 with respect to 0 level signals supplied thereto, thereby the gain of the first stage amplifier circuit 10-1 near the level "0" of the 1/0 pulse signal is reduced, and thereby the difference between signals "0" and "1" amplified and outputted by the first stage amplifier circuit 10-1 is secured even if the first stage amplifier circuit 10-1 is saturated by a high level pulse signal.

By such an operation for widening the dynamic range of the first stage amplifier circuit 10-1, change of the pulse widths of the pulse signal which is amplified by the multistage preliminary amplifier and outputted from the output terminal 11 is avoided, that is, duty distortion of the pulse signal in the amplification is prevented. Such techniques for a first stage amplifier circuit of a multistage preliminary amplifier have been disclosed in Japanese Patent Application Laid-Open No.HEI7-38342: "Preliminary Amplifier".

High speed optical fiber data transmission systems have widely been in practical use today, and the PON (Passive Optical Network) system has been proposed as an optical fiber network for constructing the FTTH (Fiber To The Home) system as a next-generation communication network. In the PON system, communication of burst signals is executed, and thus a terminal has to receive a variety of burst signals which are supplied from terminals of various distances in a star-type network connected by optical couplers. Therefore, an optical data reception device in the PON system is required to receive such burst signals correctly regardless of whether the signal level is high or low, that is, a wide dynamic range is required of the optical data reception device. Further, the optical data reception device is required high speed response capable of receiving and transmitting the burst signals correctly. In the reception and amplification of the burst signals, change of duty rate of the received burst signal (i.e. duty distortion) has to be eliminated in order to realize high speed extraction and low extraction error in a clock recovery device (a PLL (Phase Locked Loop), etc.) which is connected after the optical data reception device.

However, the conventional first stage amplifier circuit having a wide dynamic range which has been shown in FIG. 1 is implemented by feedback AGC (Automatic Gain Control) which is composed of an analog circuit, therefore, high speed response of the circuit is limited by the time constant of the analog circuit, and thus the conventional first stage amplifier circuit can not be adapted to high speed burst signals.

SUMMARY OF THE INVENTION

It is therefore the primary object of the present invention to provide a first stage amplifier circuit, by which high speed response for high speed burst signals can be implemented as well as implementing a wide dynamic range of the data reception device, and thereby a high speed data reception device for a next-generation communication network can be realized.

In accordance with a first aspect of the present invention, there is provided a first stage amplifier circuit comprising an amplifier means, a variable feedback resistance means, a judgment means and a feedback resistance control means. The amplifier means amplifies an input signal supplied thereto. The variable feedback resistance means includes two or more feedback resistors and one or more switches for changing the connection of the feedback resistors and thereby changing the composite resistance of the feedback resistors. The variable feedback resistance means is connected between the output terminal and the input terminal of the amplifier means. The judgment means judges whether or not the output signal of the amplifier means exceeds a predetermined threshold value. The feedback resistance control means operates the switches of the variable feedback resistance means one by one and successively reduces the composite resistance of the feedback resistors of the variable feedback resistance means as long as the output signal of the amplifier means is judged by the judgment means to exceed the threshold value.

In accordance with a second aspect of the present invention, in the first aspect, the two or more feedback resistors of the variable feedback resistance means are connected between the output terminal and the input terminal of the amplifier means in parallel, and each of the one or more switches of the variable feedback resistance means is connected to a corresponding one of the feedback resistors in series with the feedback resister.

In accordance with a third aspect of the present invention, in the first aspect, the two or more feedback resistors of the variable feedback resistance means are connected in series between the output terminal and the input terminal of the amplifier means, and each of the one or more switches of the variable feedback resistance means is connected to a corresponding one of the feedback resistors in parallel with the feedback resister.

In accordance with a fourth aspect of the present invention, in the first aspect, the feedback resistance control means includes a shift register having one or more stages corresponding to the switches of the variable feedback resistance means. The data input terminal of the shift register is supplied with a constant voltage. The clock terminals of the stages of the shift register are supplied with the output of the judgment means as a shift register clock signal. The data output terminals of the stages are connected to corresponding switches of the variable feedback resistance means respectively for supplying switch control signals to the switches.

In accordance with a fifth aspect of the present invention, in the first aspect, the first stage amplifier circuit further comprises a reset means for resetting the feedback resistance control means when the amplification of the input signal is completed.

In accordance with a sixth aspect of the present invention, in the first aspect, the first stage amplifier circuit further comprises a photoelectric transducer means. The photoelectric transducer means transduces a photo signal supplied thereto into photocurrent which changes corresponding to the change of the intensity of the photo signal, and supplies the photocurrent to the amplifier means.

In accordance with a seventh aspect of the present invention, in the sixth aspect, the photoelectric transducer means is a photodiode which is reversely biased.

In accordance with an eighth aspect of the present invention, in the sixth aspect, the photoelectric transducer means receives a burst signal to which preamble bits have been attached, and the judgment means judges whether or not the output signal of the amplifier means corresponding to a bit "1" of the preamble bits exceeds the predetermined threshold value.

In accordance with a ninth aspect of the present invention, in the eighth aspect, the number of the switches of the variable feedback resistance means is set at N when the number of bits of the preamble bits is 2N.

In accordance with a tenth aspect of the present invention, in the first aspect, the judgment means is implemented by a hysteresis comparator.

BRIEF DESCRIPTION OF THE DRAWINGS

The objects and features of the present invention will become more apparent from the consideration of the following detailed description taken in conjunction with the accompanying drawings, in which:

FIG. 3 is a graph showing the input-output characteristics of the first stage amplifier circuit of FIG. 2;

DESCRIPTION OF THE PREFERRED EMBODIMENTS

Figure 1:
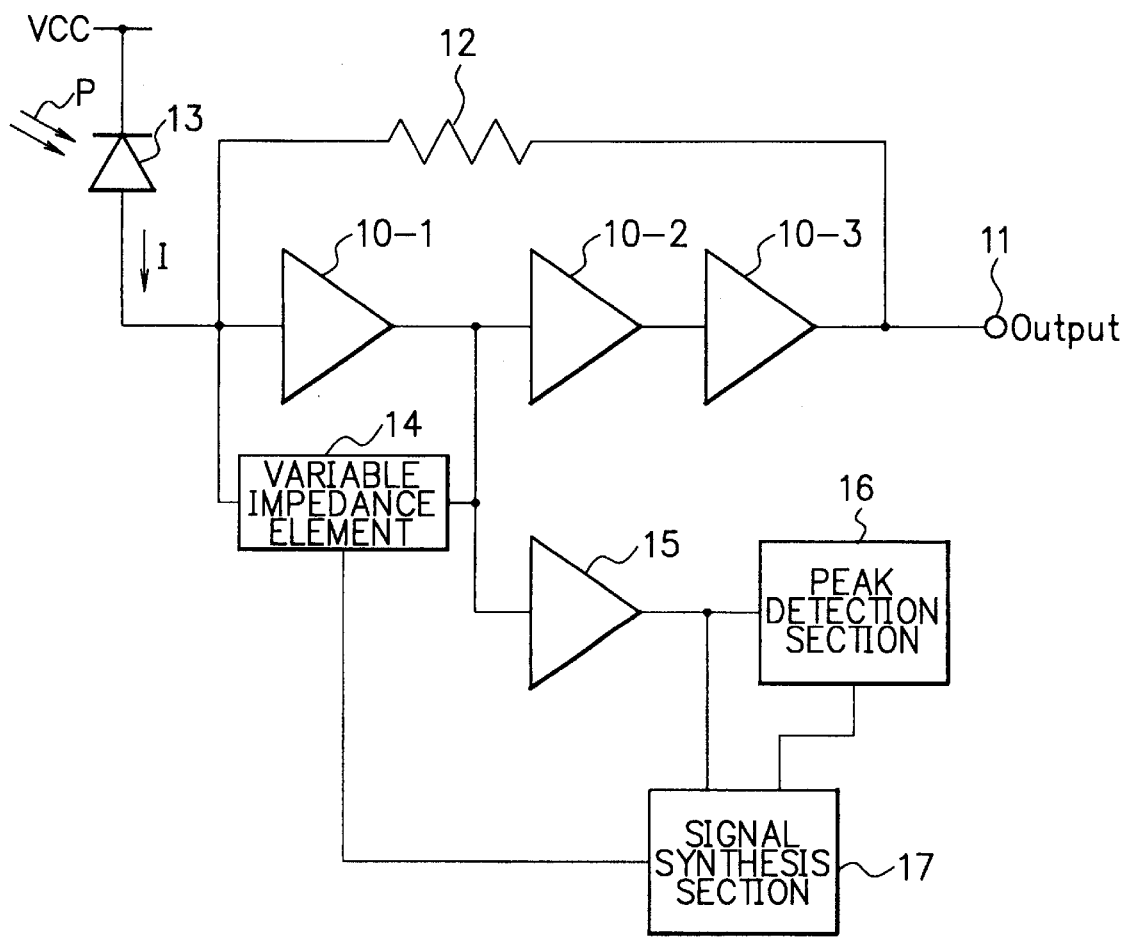
FIG. 1 is a circuit diagram showing a multistage preliminary amplifier including a conventional first stage amplifier circuit having a wide dynamic range.

Referring now to the drawings, a description will be given in detail of preferred embodiments in accordance with the present invention.

Figure 2:
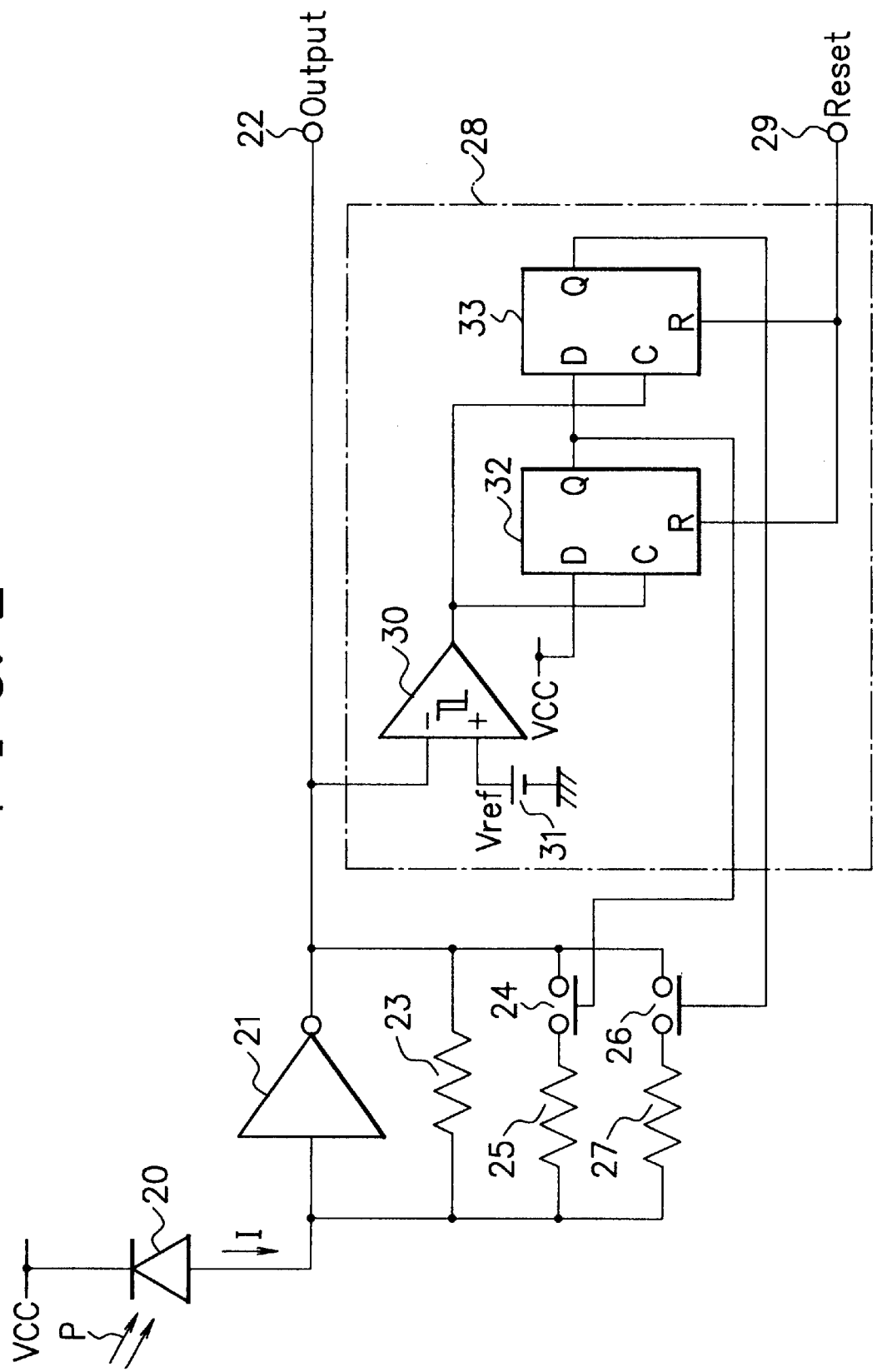
FIG. 2 is a circuit diagram showing a first stage amplifier circuit in accordance with an embodiment of the present invention.

FIG. 2 is a circuit diagram showing a first stage amplifier circuit in accordance with an embodiment of the present invention. The first stage amplifier circuit includes a photodiode (PD) 20 which generates photocurrent I depending on the intensity of a photo signal P supplied thereto, and an inversion amplifier 21 which is generally employed for an optical data reception device. A power supply voltage Vcc is applied to the cathode of the PD 20, and the anode of the PD 20 is connected to the input terminal of the inversion amplifier 21. The output terminal of the inversion amplifier 21 is connected to the output terminal 22 of the first stage amplifier circuit. A first feedback resistor 23 is connected between the output terminal and the input terminal of the inversion amplifier 21. Therefore, the photocurrent I which has been generated in the PD 13 due to the photo signal P is converted by the inversion amplifier 21 into a voltage signal, and the voltage signal is outputted from the output terminal 22.

Between the output terminal and the input terminal of the inversion amplifier 21, a feedback circuit including a first switch 24 and a second feedback resistor 25 is also connected in parallel with the first feedback resistor 23. Another connection between the output terminal and the input terminal of the inversion amplifier 21 via the second feedback resistor 25 is established when the first switch 24 is turned ON (closed), and the connection via the second feedback resistor 25 is disconnected when the first switch 24 is turned OFF (opened). Further, another feedback circuit including a second switch 26 and a third feedback resistor 27 is also connected in parallel with the first feedback resistor 23. Another connection between the output terminal and the input terminal of the inversion amplifier 21 via the third feedback resistor 27 is established when the second switch 26 is turned ON (closed), and the connection via the third feedback resistor 27 is disconnected when the second switch 26 is turned OFF (opened). Therefore, in addition to the first feedback resistor 23, one or more additional feedback resistors (25, 27) can arbitrarily be connected to the inversion amplifier 21 by the operations of the switches 24 and 26.

The output terminal of the inversion amplifier 21 is also connected to a feedback resistance control circuit 28. The feedback resistance control circuit 28 controls the connections via the second feedback resistor 25 and the third feedback resistor 27 by operating the first switch 24 and the second switch 26 respectively. The feedback resistance control circuit 28 has a reset terminal 29, and the feedback resistance control circuit 28 is reset (initialized) when a reset signal is supplied to the reset terminal 29 from outside.

The feedback resistance control circuit 28 is provided with a hysteresis comparator 30. The output terminal of the inversion amplifier 21 is connected to the inverted input terminal of the hysteresis comparator 30. A reference voltage Vref is applied by a DC voltage source 31 to the non-inverted input terminal of the hysteresis comparator 30. The reference voltage Vref is used by the hysteresis comparator 30 for determining two threshold voltages which are used for comparison. The hysteresis comparator 30 generates two threshold voltages Vth1 and Vth2 based on the reference voltage Vref. The first threshold voltage Vth1 is used by the hysteresis comparator 30 for judging whether the output signal of the inversion amplifier 21 is in a logic level "H" (High) or not, and the second threshold voltage Vth2 is used for judging whether the output signal of the inversion amplifier 21 is in a logic level "L" (Low) or not. Therefore, the hysteresis comparator 30 judges that the output signal of the inversion amplifier 21 is in the logic level "H" if the output signal level is higher than the first threshold voltage Vth1, and judges that the output signal is in the logic level "L" if the output signal level is lower than the second threshold voltage Vth2. Due to the two threshold voltages Vth1 and Vth2, hysteresis is provided to the judgment of the hysteresis comparator 30 with respect to "H" to "L" transition and "L" to "H" transition, and thereby judgment error of the hysteresis comparator is avoided even if ringing occurred to the output signal of the inversion amplifier 21.

The output terminal of the hysteresis comparator 30 is connected to clock terminals (C) of a first D-FF (Delayed-Flip Flop) 32 and a second D-FF 33. A power supply voltage Vcc of the logic level "H" is applied to the data input terminal (D) of the first D-FF 32, and thereby the logic level "H" is constantly supplied to the D-terminal. The output terminal (Q) of the first D-FF 32 is connected to the data input terminal (D) of the second D-FF 33. By the connections, the logic level of the Q-terminal of the first D-FF 32 is inputted to the D-terminal of the second D-FF 33 when a signal of the level "H" is supplied from the hysteresis comparator 30 to the clock terminals (C) of the D-FFs 32 and 33. In other words, a two-stage shift register whose clock signal is supplied from the hysteresis comparator 30 is formed by the first D-FF 32 and the second D-FF 33.

The Q-terminal of the first D-FF 32 is also connected to the first switch 24. When the logic level of the Q-terminal is "H", the first switch 24 is turned ON and the connection between the output terminal and the input terminal of the inversion amplifier 21 via the second feedback resistor 25 is established. When the logic level of the Q-terminal of the first D-FF 32 is "L", the first switch 24 is turned OFF and the connection via the second feedback resistor 25 is disconnected. Further, the Q-terminal of the second D-FF 33 is connected to the second switch 26. When the logic level of the Q-terminal is "H", the second switch 26 is turned ON and the connection between the output terminal and the input terminal of the inversion amplifier 21 via the third feedback resistor 27 is established. When the logic level of the Q-terminal of the second D-FF 33 is "L", the second switch 26 is turned OFF and the connection via the third feedback resistor 27 is disconnected. The reset terminals (R) of the D-FFs 32 and 33 are connected to the reset terminal 29. When the reset signal is supplied to the reset terminal 29 from outside, the D-FFs 32 and 33 are reset (initialized), and thereby the Q-terminals of the D-FFs 32 and 33 are forcibly set at the logic level "L". Therefore, by the reset signal, the first switch 24 and the second switch 26 are both turned OFF, and the connections via the second feedback resistor 25 and the third feedback resistor 27 are both disconnected.

In this embodiment, the photo signal P supplied to the PD 20 is supposed to be a burst signal which is composed of digital burst data. For the communication of such a burst signal, preamble bits (for indicating the beginning of the burst signal) are generally added to the front end of the burst signal in order to implement serial data transmission of such digital burst data. The preamble bits, which are data "10" repeated for a predetermined number of times, are used for establishing synchronization between the transmitting side and the receiving side.

In the following, the operation of the first stage amplifier circuit of FIG. 2 will be described in detail. First, the reset signal is inputted to the reset terminal 29 from outside, and thereby the feedback resistance control circuit 28 is initialized. By the initialization, the Q-terminals of the first D-FF 32 and the second D-FF 33 are set at the logic level "L", and thereby the first switch 24 and the second switch 26 are set OFF. In the initial state, only the first feedback resistor 23 is connected to the inversion amplifier 21 as the feedback resistance. When the pulse photo signal P is supplied to the PD 20, photocurrent I corresponding to the intensity of the 1/0 levels of the pulse photo signal P is generated by the PD 20. If we assume the resistance of the first feedback resistor 23 is Rf1, a voltage drop of Rf1×I occurs to the output terminal of the inversion amplifier 21. For example, when the resistance Rf1 of the first feedback resistor 23 is 40 KΩ and the amplitude of the photocurrent I is 5 μA, a voltage drop of 0.2 V occurs to the output terminal of the inversion amplifier 21.

The output signal of the inversion amplifier 21 is inputted to the inverted input terminal of the hysteresis comparator 30 and is compared with the first threshold voltage Vth1 and the second threshold voltage Vth2. Concretely, the preamble bits of the burst signal (the photo signal P in the form of pulses) is supplied to the PD 20, and the output of the inversion amplifier 21 corresponding to a bit "1" of the preamble bits (which have been amplified and inverted) is inputted to the inverted input terminal of the hysteresis comparator 30 and is compared with the first threshold voltage Vth1. In the comparison, if the output of the inversion amplifier 21 corresponding to the bit "1" of the preamble bits is larger than the first threshold voltage Vth1 (in the amplitude or the absolute value), the output of the hysteresis comparator 30 becomes "H". In the case where the resistance Rf1 of the first feedback resistor 23 is 40 KΩ for example, by setting the first threshold voltage Vth1 of the hysteresis comparator 30 at a voltage 0.4 V lower than the output voltage of the inversion amplifier 21 when no signal is supplied thereto, the output voltage of the inversion amplifier 21 exceeds (in the absolute value) the first threshold voltage Vth1 (0.4 V) when the photocurrent I exceeds 10 μA, and thereby the output of the hysteresis comparator 30 changes from "L" to "H". The output of the hysteresis comparator 30 ("L" to "H" transition) is supplied to the clock terminal of the first D-FF 32 as the shift register clock signal, and thereby the Q-terminal of the first D-FF 32 is changed from "L" to "H".

The output of the inversion amplifier 21 corresponding to a bit "0" of the preamble bits (which have been amplified and inverted) is inputted to the inverted input terminal of the hysteresis comparator 30 and is compared with the second threshold voltage Vth2. In the comparison, if the output of the inversion amplifier 21 corresponding to the bit "0" of the preamble bits is smaller than the second threshold voltage Vth2 (in the absolute value), the output of the hysteresis comparator 30 turns from "H" to "L". The output of the hysteresis comparator 30 becomes a pulse signal corresponding to the preamble bits, and the pulse signal is supplied to the clock terminals of the first D-FF 32 and the second D-FF 33 as the shift register clock signal.

When the first "H" level signal of the shift register clock signal is supplied to the clock terminal of the first D-FF 32, the Q-terminal of the first D-FF 32 changes from "L" to "H" since the power supply voltage Vcc of the level "H" is applied to its D-terminal, and thereby the first switch 24 is turned from OFF to ON. By the switching, the output terminal and the input terminal of the inversion amplifier 21 are connected by the first feedback resistor 23 and the second feedback resistor 25 in parallel, thereby the composite feedback resistance of the inversion amplifier 21 gets smaller than before, and the output voltage of the inversion amplifier 21 also gets lower (in the absolute value) than before. Just after the change of the output voltage of the inversion amplifier 21 into the lower value, the output voltage is compared by the hysteresis comparator 30 with the second threshold voltage Vth2 and thereby a signal of the level "L" is supplied to the clock terminals of the D-FFs 32 and 33, however, the statuses of the D-FFs 32 and 33 are not changed since the clock terminals are high-active.

When the next bit "1" of the preamble bits "101010 . . ." is supplied to the PD 20, the feedback resistance of the inversion amplifier 21 has become smaller. The output of the inversion amplifier 21 corresponding to the bit "1" of the preamble bits is supplied to the hysteresis comparator 30 and compared with the first threshold voltage Vth1. If the output of the inversion amplifier 21 corresponding to the bit "1" exceeds the first threshold voltage Vth1 (in the absolute value), the shift register clock signal is supplied from the hysteresis comparator 30 to the clock terminals of the D-FFs 32 and 33, thereby the data at the Q-terminal of the first D-FF 32 is inputted to the D-terminal of the second D-FF 33, and thereby the second switch 26 is turned from OFF to ON. By the switching, the output terminal and the input terminal of the inversion amplifier 21 are connected by the first feedback resistor 23, the second feedback resistor 25 and the third feedback resistor 27 in parallel, thereby the composite feedback resistance of the inversion amplifier 21 further gets smaller, and the output voltage of the inversion amplifier 21 also gets lower. On the other hand, if the output of the inversion amplifier 21 corresponding to the bit "1" does not exceed the first threshold voltage Vth1 (in the absolute value), the shift register clock signal is not supplied to the clock terminals of the D-FFs 32 and 33 since the composite feedback resistance of the inversion amplifier 21 has already been adapted to the most suitable reception range, thereby reception of the following burst signal is executed with the first switch 24 ON and the second switch 26 OFF. Incidentally, when a reset signal generation section outside the first stage amplifier circuit detected the completion of the reception of the burst signal, the reset signal generation section supplies the reset signal to the reset terminal 29. By the operation described above, the feedback resistance of the inversion amplifier 21 is set at the most suitable value on every reception of a burst signal.

As described above, in the first stage amplifier circuit according to the embodiment of the present invention, the output voltage of the inversion amplifier 21 corresponding to the bit "1" of the preamble bits of the burst photo signal P received by the PD 20 is compared by the hysteresis comparator 30 with the threshold voltages Vth1 and Vth2, thereby the feedback resistance of the inversion amplifier 21 is set to the most suitable value on every reception of a burst signal, and thereby the gain of the inversion amplifier 21 is set to the most suitable level depending on the intensity of the burst photo signal P which is supplied from a terminal and received by the PD 20. Therefore, both a wide dynamic range and high speed response of the first stage amplifier circuit is realized, and thus duty distortion of the high speed pulse burst signal in the amplification is eliminated.

FIG. 3 is a graph showing the input-output characteristics of the first stage amplifier circuit of this embodiment. In the input-output characteristics 40 shown in FIG. 3, the horizontal axis denotes the photocurrent I generated by the PD 20 due to the incidence of the photo signal P in a logarithmic scale, and the vertical axis denotes the output voltage at the output terminal 22 in a logarithmic scale. In the case where both the first switch 24 and the second switch 26 are set OFF, only the first feedback resistor 23 is connected to the inversion amplifier 21 as the feedback resistance, thereby the feedback resistance becomes the largest, and thereby the gain of the inversion amplifier 21 becomes the largest as shown by the character line 41. In the case where the first switch 24 is set ON and the second switch 26 is set OFF, the first feedback resistor 23 and the second feedback resistor 25 are connected to the inversion amplifier 21 as the feedback resistance, thereby the feedback resistance becomes smaller, and thereby the gain of the inversion amplifier 21 is also made smaller as shown by the character line 42. In the case where both the first switch 24 and the second switch 26 are set ON, the three feedback resistors 23, 25 and 27 are connected to the inversion amplifier 21 as the feedback resistance, thereby the feedback resistance becomes the smallest, and thereby the gain of the inversion amplifier 21 becomes the smallest as shown by the character line 43. In this case, the output voltage of the inversion amplifier 21 is reduced the most (in the absolute value).

When the photocurrent I generated by the PD 20 is lower than or equal to a current I1 shown in FIG. 3, the output of the inversion amplifier 21 is not saturated even if both the first switch 24 and the second switch 26 are OFF. When the photocurrent I is higher than I1, the first switch 24 is first turned ON since the inversion amplifier 21 can be saturated, thereby the feedback resistance of the inversion amplifier 21 is reduced before the saturation, and thus the output voltage is reduced as shown by the character line 42. If the photocurrent I remains between I1 and I2, there is no need for further operation of the switches 24 and 26. If the photocurrent I exceeds I2, the second switch 26 is further turned ON since the inversion amplifier 21 can be saturated, and thus the output voltage is reduced further as shown by the character line 43. By controlling the feedback resistance of the inversion amplifier 21 properly depending on the intensity of the photo signal P received by the PD 20 (that is, depending on the level of the photocurrent I generated by the PD 20) as shown in FIG. 3, the gain of the inversion amplifier 21 is set appropriately and saturation of the inversion amplifier 21 is avoided, and thus a wide dynamic range of the first stage amplifier circuit is realized.

Figure 4:
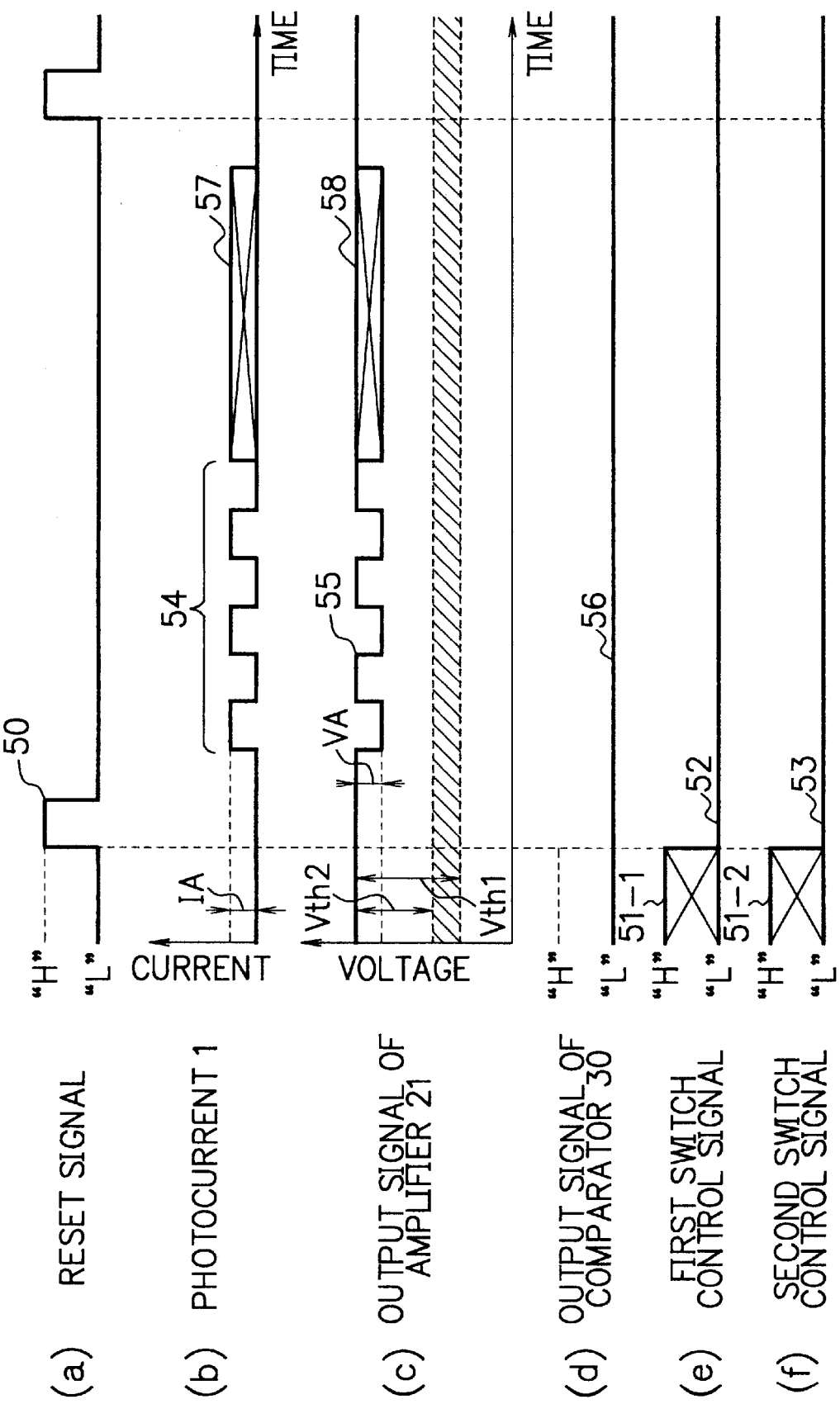
FIGS. 4(a)–4(f) are timing charts showing the operation of each component of a feedback resistance control circuit of the first stage amplifier circuit of FIG. 2 in the case where the intensity of a photo signal supplied to the first stage amplifier circuit is low.
Figure 5:
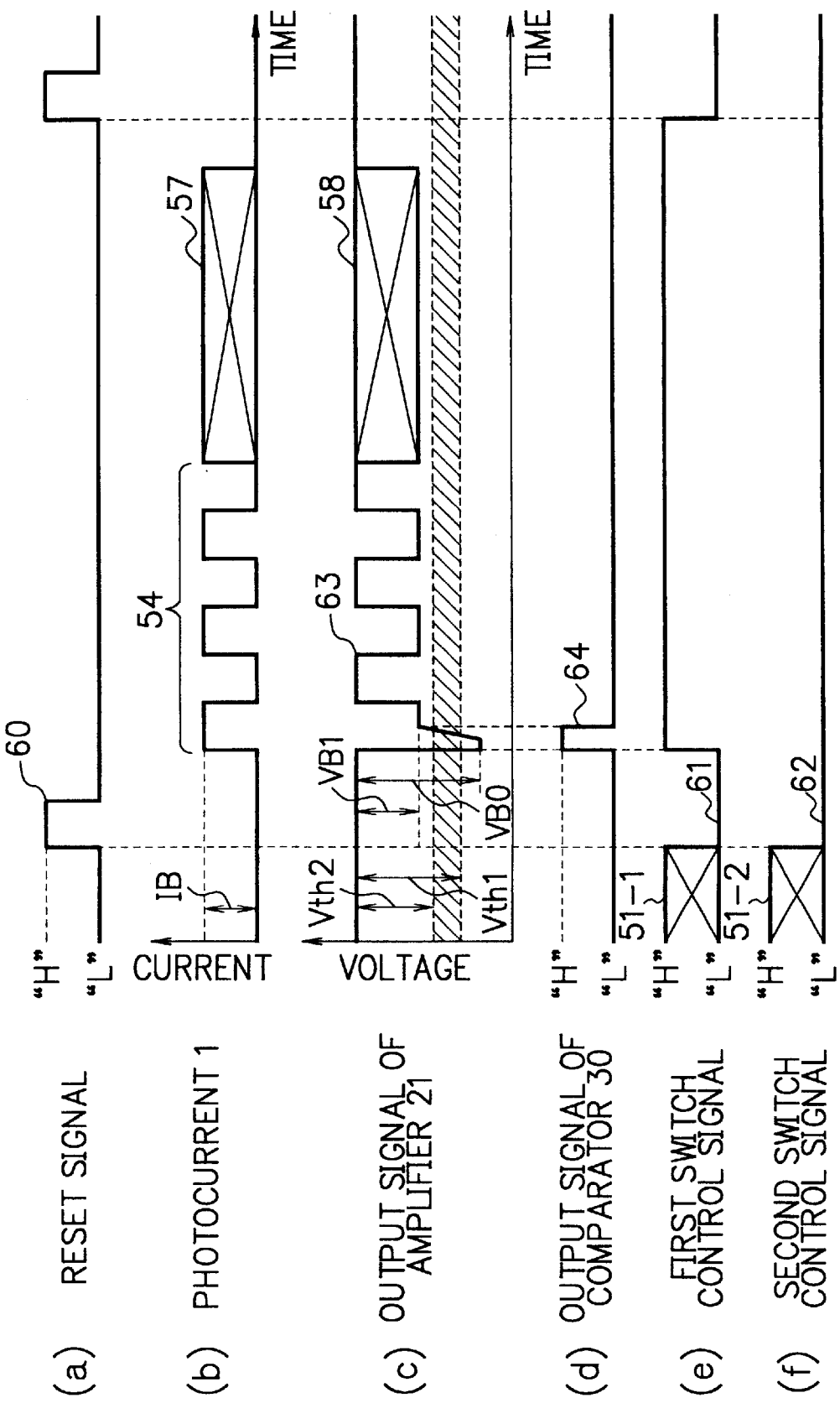
FIGS. 5(a)–5(f) are timing charts showing the operation of each component of the feedback resistance control circuit in the case where the intensity of the photo signal is middle.
Figure 6:
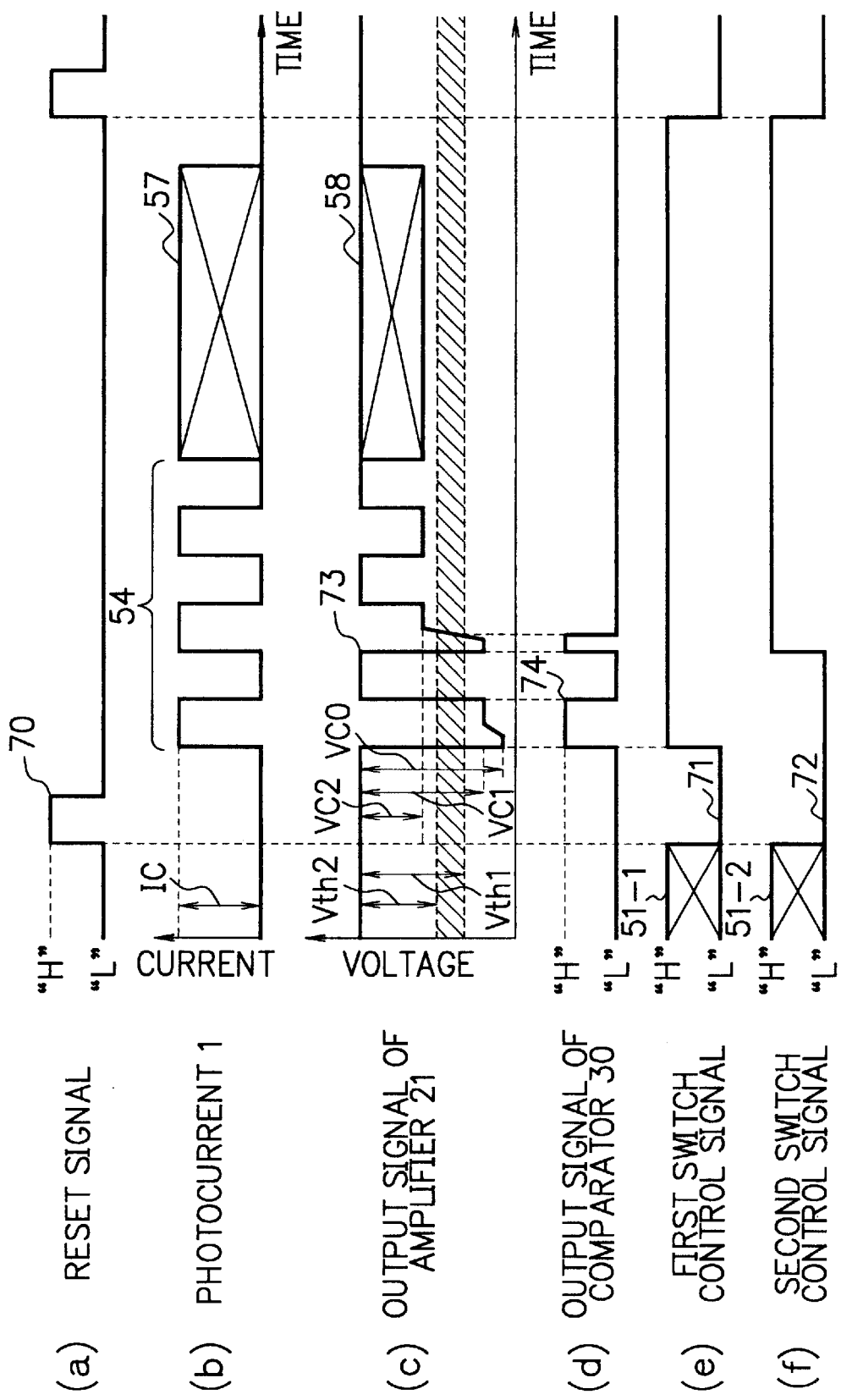
FIGS. 6(a)–6(f) are timing charts showing the operation of each component of the feedback resistance control circuit in the case where the intensity of the photo signal is high.

In the following, the operation of each component of the feedback resistance control circuit 28 will be described in detail referring to FIGS. 4, 5 and 6 with respect to cases where the intensity of the photo signal P is low, middle and high. FIG. 4 is a timing chart showing the operation of each component of the feedback resistance control circuit 28 in the case where the intensity of the photo signal P is low. In the case of FIG. 4, both the first switch 24 and the second switch 26 are set OFF, thereby the feedback resistance of the inversion amplifier 21 (only by the first feedback resistor 23) is made the largest, and thereby the gain of the inversion amplifier 21 is made the largest. FIG. 5 is a timing chart showing the operation of each component of the feedback resistance control circuit 28 in the case where the intensity of the photo signal P is middle. In the case of FIG. 5, only the first switch 24 is turned ON, thereby the feedback resistance of the inversion amplifier 21 (by the first feedback resistor 23 and the second feedback resistor 25) is made smaller, and thereby the gain of the inversion amplifier 21 is made smaller. FIG. 6 is a timing chart showing the operation of each component of the feedback resistance control circuit 28 in the case where the intensity of the photo signal P is high. In the case of FIG. 6, both the first switch 24 and the second switch 26 are turned ON, thereby the feedback resistance of the inversion amplifier 21 (by the three feedback resistors 23, 25 and 27) is made the smallest, and thereby the gain of the inversion amplifier 21 is made the smallest. Incidentally, the following description will be given on the assumption that the preamble bits are 6-bit data "101010" which is added to the front end of the burst data.

Referring to FIG. 4 showing the case where the intensity of the photo signal P is low, the chart (a) of FIG. 4 shows the timing of the reset signal which is supplied to the reset terminal 29. The chart (b) of FIG. 4 shows the timing of the photocurrent I which is generated by the PD 20 due to the incidence of the photo signal P. The chart (c) of FIG. 4 shows the timing of the output signal of the inversion amplifier 21 which is inputted to the inverted input terminal of the hysteresis comparator 30. The chart (c) of FIG. 4 also shows the output signal of the first stage amplifier circuit. In the chart (c), the first threshold voltage Vth1 and the second threshold voltage Vth2 of the hysteresis comparator 30 are also indicated, in which the diagonally shaded area between the threshold voltages Vth1 and Vth2 indicates the hysteresis of the hysteresis comparator 30. The chart (d) of FIG. 4 shows the timing of the output signal of the hysteresis comparator 30. The chart (e) of FIG. 4 shows the timing of a first switch control signal which is outputted from the Q-terminal of the first D-FF 32 for controlling ON/OFF of the first switch 24. The chart (f) of FIG. 4 shows the timing of a second switch control signal which is outputted from the Q-terminal of the second D-FF 33 for controlling ON/OFF of the second switch 26.

When the reset signal is supplied from the unshown reset signal generation section to the reset terminal 29 (the signal 50 shown in the chart (a) of FIG. 4), the Q-terminals of the first D-FF 32 and the second D-FF 33 are initialized in sync with the rising edge of the reset signal, and thereby the logic levels of the Q-terminals change from "undefined" (signals 51-1, 51-2) to "L" (signals 52 and 53). The preamble bits 54 (which have been transduced into the photocurrent I by the PD 20) are amplified and outputted by the inversion amplifier 21 after being inverted (signal 55). Here, we assume that the amplitude of the photocurrent I which has been generated by the PD 20 is IA and the amplitude of the output voltage of the inversion amplifier 21 corresponding to the photocurrent I is VA. The output voltage VA (amplitude) is not larger than the first threshold voltage Vth1, and thus the output of the hysteresis comparator 30 remains "L" (signal 56). Therefore, a logic level "L" is supplied to the clock terminals of the first D-FF 32 and the second D-FF 33, thereby the shift register is not activated, and thereby the output signals of the D-FFs 32 and 33 (i.e. the first switch control signal and the second switch control signal) remain "L" (signals 52 and 53). The burst data 57 which is supplied after the preamble bits 54 is amplified by the inversion amplifier 21 (having only the first feedback resistor 23 as the feedback resistance) and outputted from the output terminal 22 (signal 58). The amplification of the received burst data 57 is executed with the largest gain of the inversion amplifier 21. After the reception of the burst data 57 is completed, the unshown reset signal generation section supplies the reset signal to the reset terminal 29 and thereby the feedback resistance control circuit 28 is reset (initialized).

Referring to FIG. 5 showing the case where the intensity of the photo signal P is middle, the chart (a) of FIG. 5 shows the timing of the reset signal which is supplied to the reset terminal 29. The chart (b) of FIG. 5 shows the timing of the photocurrent I which is generated by the PD 20 due to the incidence of the photo signal P. The chart (c) of FIG. 5 shows the timing of the output signal of the inversion amplifier 21 which is inputted to the inverted input terminal of the hysteresis comparator 30. The chart (c) of FIG. 5 also shows the output signal of the first stage amplifier circuit. In the chart (c), the first threshold voltage Vth1 and the second threshold voltage Vth2 of the hysteresis comparator 30 are also indicated, in which the diagonally shaded area between the threshold voltages Vth1 and Vth2 indicates the hysteresis of the hysteresis comparator 30. The chart (d) of FIG. 5 shows the timing of the output signal of the hysteresis comparator 30. The chart (e) of FIG. 5 shows the timing of the first switch control signal which is outputted from the Q-terminal of the first D-FF 32 for controlling ON/OFF of the first switch 24. The chart (f) of FIG. 5 shows the timing of the second switch control signal which is outputted from the Q-terminal of the second D-FF 33 for controlling ON/OFF of the second switch 26.

When the reset signal is supplied from the unshown reset signal generation section to the reset terminal 29 (the signal 60 shown in the chart (a) of FIG. 5), the Q-terminals of the first D-FF 32 and the second D-FF 33 are initialized in sync with the rising edge of the reset signal, and thereby the logic levels of the Q-terminals change from "undefined" (signals 51-1, 51-2) to "L" (signals 61 and 62). The preamble bits 54 (which have been transduced into the photocurrent I by the PD 20) are amplified and outputted by the inversion amplifier 21 after being inverted (signal 63). Here, we assume that the amplitude of the photocurrent I which has been generated by the PD 20 is IB and the amplitude of the output voltage of the inversion amplifier 21 corresponding to the photocurrent I is VB0. The output voltage VB0 (amplitude) is larger than the first threshold voltage Vth1, and thus the output of the hysteresis comparator 30 turns "H" (signal 64). Therefore, the logic level "H" is supplied to the clock terminal of the first D-FF 32, thereby the Q-terminal of the first D-FF 32 turns "H" (signal 61) (that is, the first switch control signal turns "H"), and thereby the first switch 24 is turned ON. By the switching, the feedback resistance of the inversion amplifier 21 (by the composite resistance of the first feedback resistor 23 and the second feedback resistor 25 connected in parallel) becomes smaller, and thereby the output voltage (amplitude) of the inversion amplifier 21 becomes a smaller value VB1 (signal 63).

During the transition of the output voltage of the inversion amplifier 21 from VB0 to VB1, the output voltage gets lower (in the absolute value) than the second threshold voltage Vth2 for the judgment of the logic level "L", therefore, the output of the hysteresis comparator 30 turns "L" (signal 64). At this stage with the first switch 24 turned ON and the second switch 26 turned OFF, the gain of the inversion amplifier 21 has been set appropriately, and thus saturation of the inversion amplifier 21 does not occur. Therefore, when the next bit "1" of the preamble bits is supplied, the shift register clock signal is not supplied to the clock terminals of the D-FFs 32 and 33, therefore, the shift register remains untouched and thus the first switch control signal and the second switch control signal remain "H" and "L" respectively (signals 61 and 62). The burst data 57 which is supplied after the preamble bits 54 is amplified by the inversion amplifier 21 (having the first feedback resistor 23 and the second feedback resistor 25 connected in parallel as the feedback resistance) and outputted from the output terminal 22 (signal 58). The amplification of the received burst data 57 is executed with the smaller gain of the inversion amplifier 21. After the reception of the burst data 57 is completed, the unshown reset signal generation section supplies the reset signal to the reset terminal 29 and thereby the feedback resistance control circuit 28 is reset (initialized).

Referring to FIG. 6 showing the case where the intensity of the photo signal P is high, the chart (a) of FIG. 6 shows the timing of the reset signal which is supplied to the reset terminal 29. The chart (b) of FIG. 6 shows the timing of the photocurrent I which is generated by the PD 20 due to the incidence of the photo signal P. The chart (c) of FIG. 6 shows the timing of the output signal of the inversion amplifier 21 which is inputted to the inverted input terminal of the hysteresis comparator 30. The chart (c) of FIG. 6 also shows the output signal of the first stage amplifier circuit. In the chart (c), the first threshold voltage Vth1 and the second threshold voltage Vth2 of the hysteresis comparator 30 are also indicated, in which the diagonally shaded area between the threshold voltages Vth1 and Vth2 indicates the hysteresis of the hysteresis comparator 30. The chart (d) of FIG. 6 shows the timing of the output signal of the hysteresis comparator 30. The chart (e) of FIG. 6 shows the timing of the first switch control signal which is outputted from the Q-terminal of the first D-FF 32 for controlling ON/OFF of the first switch 24. The chart (f) of FIG. 6 shows the timing of the second switch control signal which is outputted from the Q-terminal of the second D-FF 33 for controlling ON/OFF of the second switch 26.

When the reset signal is supplied from the unshown reset signal generation section to the reset terminal 29 (the signal 70 shown in the chart (a) of FIG. 6), the Q-terminals of the first D-FF 32 and the second D-FF 33 are initialized in sync with the rising edge of the reset signal, and thereby the logic levels of the Q-terminals change from "undefined" (signals 51-1, 51-2) to "L" (signals 71 and 72). The preamble bits 54 (which have been transduced into the photocurrent I by the PD 20) are amplified and outputted by the inversion amplifier 21 after being inverted (signal 73). Here, we assume that the amplitude of the photocurrent I which has been generated by the PD 20 is IC and the amplitude of the output voltage of the inversion amplifier 21 corresponding to the photocurrent I is VC0. The output voltage VC0 (amplitude) is larger than the first threshold voltage Vth1, and thus the output of the hysteresis comparator 30 turns "H" (signal 74). Therefore, the logic level "H" is supplied to the clock terminal of the first D-FF 32, thereby the Q-terminal of the first D-FF 32 turns "H" (signal 71) (that is, the first switch control signal turns "H"), and thereby the first switch 24 is turned ON. By the switching, the feedback resistance of the inversion amplifier 21 (by the composite resistance of the first feedback resistor 23 and the second feedback resistor 25 connected in parallel) becomes smaller, and thereby the output voltage (amplitude) of the inversion amplifier 21 becomes a smaller value VC1 (signal 73).

Even after the transition of the output voltage of the inversion amplifier 21 from VC0 to VC1, the output voltage remains higher than the first threshold voltage Vth1 for the judgment of the logic level "H", therefore, the output of the hysteresis comparator 30 remains "H" (signal 74). At this stage with the first switch 24 turned ON and the second switch 26 turned OFF, the gain of the inversion amplifier 21 has not been set appropriately, and thus saturation of the inversion amplifier 21 occurs. Therefore, when the next bit "1" of the preamble bits is supplied, the shift register clock signal is supplied to the clock terminals of the D-FFs 32 and 33, therefore, the shift register executes bit shift, that is, both the Q-terminals of the D-FFs 32 and 33 become "H", thereby both the first switch control signal and the second switch control signal become "H" (signals 71 and 72), and thereby both the first switch 24 and the second switch 26 are set ON. By the switching, the feedback resistance of the inversion amplifier 21 (by the composite resistance of the three feedback resistors 23, 25 and 27 connected in parallel) becomes still smaller (the smallest), and thereby the output voltage (amplitude) of the inversion amplifier 21 becomes a still smaller value VC2 (signal 73).

During the transition of the output voltage of the inversion amplifier 21 from VC1 to VC2, the output voltage gets lower than the second threshold voltage Vth2 for the judgment of the logic level "L", therefore, the output of the hysteresis comparator 30 turns "L" (signal 74). At this stage with the first switch 24 and the second switch 26 both turned ON, the gain of the inversion amplifier 21 has been set appropriately, and thus saturation of the inversion amplifier 21 does not occur. Therefore, when the next bit "1" of the preamble bits is supplied, the shift register clock signal is not supplied to the clock terminals of the D-FFs 32 and 33, therefore, the shift register remains untouched and thus both the first switch control signal and the second switch control signal remain "H" (signals 71 and 72). The burst data 57 which is supplied after the preamble bits 54 is amplified by the inversion amplifier 21 (having the three feedback resistors 23, 25 and 27 connected in parallel as the feedback resistance) and outputted from the output terminal 22 (signal 58). The amplification of the received burst data 57 is executed with the smallest gain of the inversion amplifier 21. After the reception of the burst data 57 is completed, the unshown reset signal generation section supplies the reset signal to the reset terminal 29 and thereby the feedback resistance control circuit 28 is reset (initialized).

As described above, the first stage amplifier circuit of this embodiment digitally detects the intensity of the preamble bits which have been added to the front end of the burst data, and successively establishes the connections of the feedback resistors 23, 25 and 27 which are placed in parallel depending on the detected intensity of the preamble bits, thereby the gain of the inversion amplifier 21 is set to the most suitable value, and thereby both a wide dynamic range and high speed response of the first stage amplifier circuit are realized. More concretely, the preamble bits which are received by the PD 20 prior to the burst data is transduced by the PD 20 into the photocurrent I, and the photocurrent I is amplified and inverted by the inversion amplifier 21. The output signal of the inversion amplifier 21 corresponding to the bit "1" of the preamble bits is inputted to the inverted input terminal of the hysteresis comparator 30 and compared with the first threshold voltage Vth1. In the initial state after reset, the output terminal and the input terminal of the inversion amplifier 21 are connected via the first feedback resistor 23 only, and thereby the feedback resistance and the gain of the inversion amplifier 21 is set the largest. Between the output terminal and the input terminal of the inversion amplifier 21, the second feedback resistor 25 and the third feedback resistor 27 are also connected in parallel via the first switch 24 and the second switch 26 respectively. The first switch 24 and the second switch 26 are both set OFF in the initial state after reset. When the output of the inversion amplifier 21 corresponding to the bit "1" is judged by the hysteresis comparator 30 to be larger (in amplitude) than the first threshold voltage Vth1, the shift register clock signal is supplied to the shift register which is composed of the first D-FF 32 and the second D-FF 33. The Q-terminals of the first D-FF 32 and the second D-FF 33 are connected to the first switch 24 and the second switch 26 respectively. Therefore, on every reception of a bit "1" of the preamble bits, the comparison between the output of the inversion amplifier 21 corresponding to the bit "1" and the first threshold voltage Vth1 is executed by the hysteresis comparator 30, and the connections of the second feedback resistor 25 and the third feedback resistor 27 are established one by one if the output of the inversion amplifier 21 corresponding to the bit "1" is larger than the first threshold voltage Vth1. By such control of the feedback resistance of the inversion amplifier 21, the gain of the inversion amplifier 21 is controlled appropriately depending on the intensity of the photo signal P which is supplied to the first stage amplifier circuit, and thereby saturation of the inversion amplifier 21 (i.e. saturation of the output signal of the first stage amplifier circuit) is eliminated. The feedback resistance control circuit 28 is implemented by a digital circuit, therefore, a first stage amplifier circuit with a wide dynamic range and high speed response is realized, and thereby duty distortion of high speed burst signal can be eliminated.

Incidentally, while the inversion amplifier 21 (which converts the photocurrent I into an inverted voltage signal) has been employed in the above embodiment, a non-inversion amplifier can also be employed as the amplifier of the first stage amplifier circuit. In such cases, a comparator having two non-inverted input terminals is used for the comparison, and an inverter gate is used for the feedback.

The resistance of each feedback resistor (23, 25, 27) can be set at the same resistance since composite resistance of the feedback resistors can be figured out and set simply. However, it is also possible to set the resistance of each feedback resistor differently so that the dynamic range of the first stage amplifier circuit will be wider.

While the number of the feedback resistors was three in the above embodiment, of course the number can be 2, or 4 or more. For example, when the number of the feedback resistors is n, (n-1) switches are provided for connecting/disconnecting the feedback resistors, and (n-1) D-FFs are provided to the feedback resistance control circuit 28. The output terminal (Q-terminal) of each D-FF is connected to a corresponding switch which is connected in series with a corresponding feedback resistor.

Figure 7:
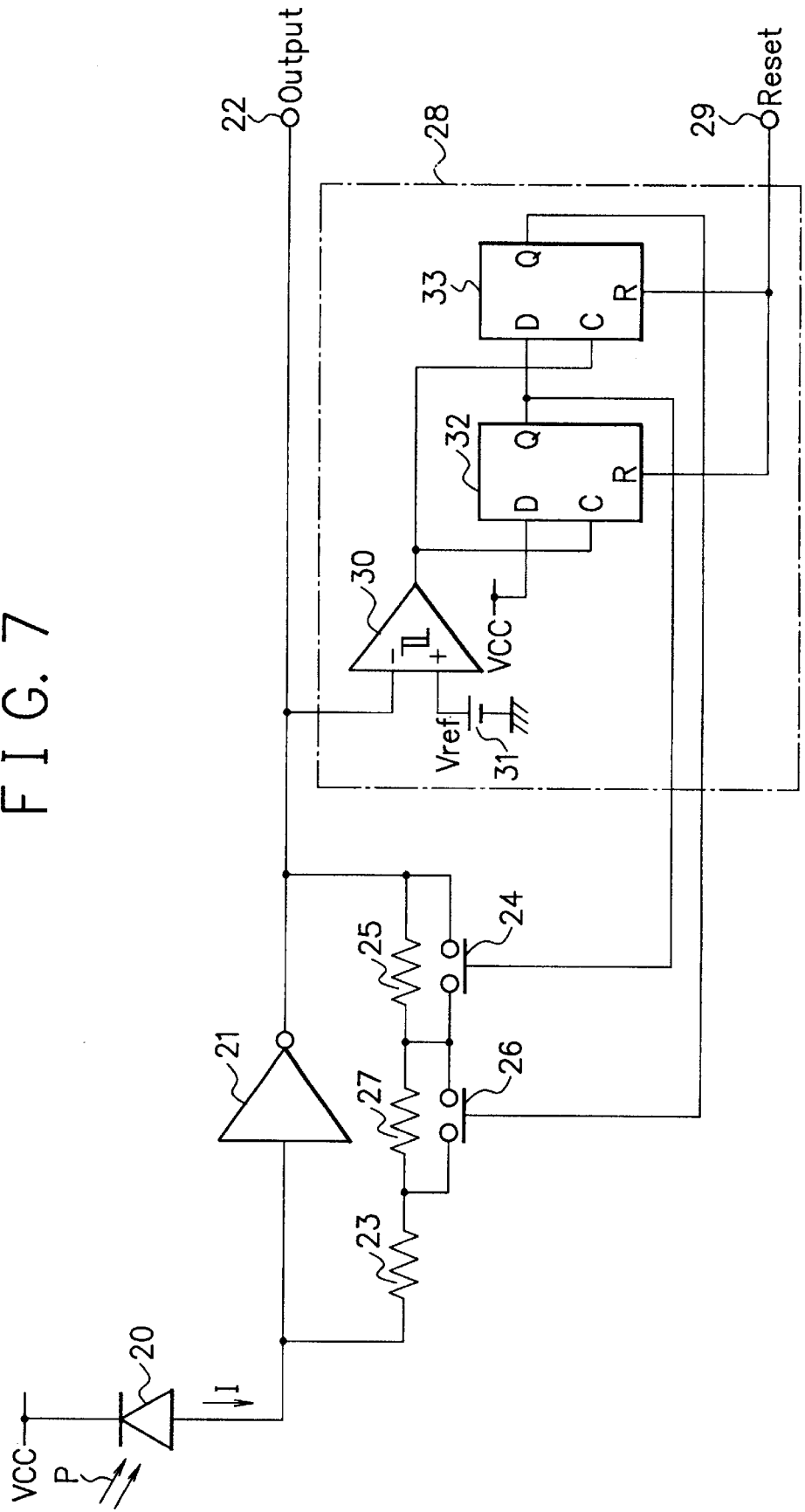
FIG. 7 is a circuit diagram showing another example of a first stage amplifier circuit in accordance with the present invention which employs a variable feedback resistance including three feedback resistors connected in series.

While the feedback resistors for implementing the variable feedback resistance were connected in parallel in the above embodiment, the variable feedback resistance can also be implemented by feedback resistors connected in series and switches for bypassing the feedback resistors. FIG. 7 is a circuit diagram showing another example of a first stage amplifier circuit in accordance with the present invention which employs such a variable feedback resistance. Referring to FIG. 7, the variable feedback resistance is composed of a first feedback resistor 23, a second feedback resistor 25, a third feedback resistor 27, a first switch 24 and a second switch 26, similarly to the variable feedback resistance shown in FIG. 2. In FIG. 7, the feedback resistors 23, 25 and 27 are connected in series between the output terminal and the input terminal of the inversion amplifier 21. The first switch 24 is placed in parallel with the second feedback resistor 25, and the second switch 26 is placed in parallel with the third feedback resistor 27. The operation of the variable feedback resistance shown in FIG. 7 is as follows. After the initialization of the feedback resistance control circuit 28 by the reset signal, the first switch control signal and the second switch control signal outputted by the Q-terminals of the D-FFs 32 and 33 are both "L", thereby both the switches 24 and 26 are set OFF (opened), and thus the composite resistance of the variable feedback resistance becomes the largest (the sum of the resistance of the three feedback resistors 23, 25 and 27). When the first switch control signal is "H" and the second switch control signal is "L", the first switch 24 and the second switch 26 are set ON and OFF respectively, thereby the composite resistance of the variable feedback resistance becomes smaller (the sum of the resistance of the feedback resistors 23 and 27). When the first switch control signal and the second switch control signal are both "H", both the switches 24 and 26 are set ON (closed), and thus the composite resistance of the variable feedback resistance becomes the smallest (the resistance of the feedback resistor 23 only). Therefore, the gain control of the inversion amplifier 21 according the present invention can also be executed in the first stage amplifier circuit shown in FIG. 7 employing the series connection of the feedback resistors. The connections of the feedback resistors and the switches which have been shown in FIGS. 1 and 7 are only examples, and thus other types of connections can of course be employed for the variable feedback resistance.

While the above description has been given on the assumption that the preamble bits which are received by the first stage amplifier circuit before the burst data are 6-bit data "101010", 4-bit data "1010" can also be used as the preamble bits in the case where the number of the feedback resistors is 3 (i.e. in the case where the number of switches (the number of D-FFs) is 2). By use of the 4-bit preamble bits "1010", two times of switching (reduction of the variable feedback resistance) can be executed by the two switches. In general, when the number of bits of the preamble bits is 2N, it is preferable that the number of the switches of the variable feedback resistance is set at N. When the number of the switches is set at N or more, the gain control of the inversion amplifier 21 can be executed using all the 2N-bit preamble bits, and thus the dynamic range of the first stage amplifier circuit can be set wide. However, if the number of the switches is set unduly large, a large number of switches and corresponding D-FFs and resistors are not used at all, and thus circuit scale and the cost of the first stage amplifier circuit becomes unduly large. On the other hand, when the number of the switches is set at N or less, the gain control of the inversion amplifier 21 can be executed using (or preparing) all the switches, and thus the complete wastage of the components (switches, D-FFs and resistors) does not occur. However, if the number of the switches is set unduly small, the dynamic range of the first stage amplifier circuit can not be set wide or the gain control can not be executed precisely. Therefore, when the number of the switches is set at N, both the wide dynamic range (and precise gain control) and small circuit scale (and low cost) of the first stage amplifier circuit can be attained. However, the setting of the number of the switches is not needed to be done so strictly. The object of the present invention can be attained if the number is set adequately.

As set forth hereinabove, in the first stage amplifier circuit in accordance with the present invention, a variable feedback resistance, including two or more feedback resistors and one or more switches for changing the connection of the feedback resistors and thereby changing the composite resistance of the feedback resistors, is connected between the output terminal and the input terminal of the amplifier of the first stage amplifier circuit. A comparator judges whether or not the output signal of the amplifier exceeds a predetermined threshold value. A feedback resistance control circuit operates the switches of the variable feedback resistance one by one and successively reduces the composite resistance of the feedback resistors of the variable feedback resistance as long as the output signal of the amplifier is judged by the comparator to exceed the threshold value. Therefore, the composite resistance of the variable feedback resistance and the gain of the amplifier are controlled adequately by the comparator, the feedback resistance control circuit and the switches which are implemented as a digital circuit, thereby both a wide dynamic range and high speed response of the first stage amplifier circuit are realized. Therefore, saturation of the amplifier is prevented and thus duty distortion of the input signal can be eliminated even if the level of the input signal is very high and even if the input signal is a high speed signal.

The variable feedback resistance can be implemented by parallel connection of the two or more feedback resistors. In such cases, the two or more feedback resisters of the variable feedback resistance are connected between the output terminal and the input terminal of the amplifier in parallel, and each of the one or more switches of the variable feedback resistance is connected to a corresponding one of the feedback resisters in series with the feedback resister.

The variable feedback resistance can also be implemented by series connection of the two or more feedback resisters. In such cases, the two or more feedback resisters of the variable feedback resistance are connected in series between the output terminal and the input terminal of the amplifier, and each of the one or more switches of the variable feedback resistance is connected to a corresponding one of the feedback resisters in parallel with the feedback resister.

The feedback resistance control circuit can be implemented by a shift register having one or more stages corresponding to the switches of the variable feedback resistance. The data input terminal of the shift register is supplied with a constant voltage. The clock terminals of the stages of the shift register are supplied with the output of the comparator as a shift register clock signal. The data output terminals of the stages are connected to corresponding switches of the variable feedback resistance respectively for supplying switch control signals to the switches. By such digital composition of the feedback resistance control circuit, high speed operation of the first stage amplifier circuit is realized.

The first stage amplifier circuit can include a reset signal generation section for resetting (initializing) the feedback resistance control circuit when the amplification of an input signal (a burst signal, for example) is completed. By the initialization, the gain control of the amplifier can be executed correctly on every reception of a signal.

The first stage amplifier circuit can include a photoelectric transducer for transducing a photo signal supplied thereto into photocurrent which changes corresponding to the change of the intensity of the photo signal and supplying the photocurrent to the amplifier. A photodiode which is reversely biased can be employed as the photoelectric transducer. By the employment of the photoelectric transducer, the high speed first stage amplifier circuit with a wide dynamic range can be applied to optical data reception devices in a next-generation high speed optical communication system such as the PON (Passive Optical Network) system.

The first stage amplifier circuit including the photoelectric transducer can use preamble bits (which have been attached to the front end of a burst signal) for the gain control of the amplifier. In such cases, the comparator judges whether or not the output signal of the amplifier corresponding to a bit "1" of the preamble bits exceeds the predetermined threshold value. Therefore, the high speed first stage amplifier circuit with a wide dynamic range can be applied to next-generation high speed optical communication networks which communicate burst signals, without needing additional devices or protocols.

Preferably, the number of the switches of the variable feedback resistance is set at N when the number of bits of the preamble bits is 2N. By such setting, both the wide dynamic range (and precise gain control) and small circuit scale (and low cost) of the first stage amplifier circuit can be attained.

Preferably, a hysteresis comparator is employed as the comparator. By use of the hysteresis comparator, judgment error of the comparator is avoided even if ringing occurred to the output signal of the amplifier.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A first stage amplifier circuit comprising:
    amplifier means for amplifying an input signal supplied thereto;
    a variable feedback resistance means connected between an output terminal and an input terminal of the amplifier means, including two or more feedback resistors and one or more switches for changing a connection of the feedback resistors and thereby changing a composite resistance of the feedback resistors;
    a judgment means for judging whether the output signal of the amplifier means exceeds a first predetermined threshold value and a second predetermined threshold value; and
    a feedback resistance control means for operating the one or more switches of the variable feedback resistance means one by one and successively reducing the composite resistance of the feedback resistors of the variable feedback resistance means as long as the output signal of the amplifier means is judged by the judgment means to exceed the first and second predetermined threshold values.

2. The first stage amplifier circuit as claimed in claim 1, wherein the two or more feedback resistors of the variable feedback resistance means are connected between the output terminal and the input terminal of the amplifier means in parallel, and each of the one or more switches of the variable feedback resistance means is connected to a corresponding one of the feedback resistors in series with the feedback resistor.

3. The first stage amplifier circuit as claimed in claim 1, wherein the two or more feedback resistors of the variable feedback resistance means are connected in series between the output terminal and the input terminal of the amplifier means, and each of the one or more switches of the variable feedback resistance means is connected to a corresponding one of the feedback resistors in parallel with the feedback resistor.

4. A first stage amplifier circuit, comprising:
    amplifier means for amplifying an input signal supplied thereto a variable feedback resistance means which is connected between an output terminal and an input terminal of the amplifier means, including two or more feedback resistors and one or more switches for changing a connection of the feedback resistors and thereby changing a composite resistance of the feedback resistors;
    a judgment means for judging whether the output signal of the amplifier means exceeds a predetermined threshold value; and
    a feedback resistance control means for operating the switches of the variable feedback resistance means one by one and successively reducing the composite resistance of the feedback resistors of the variable feedback resistance means as long as the output signal of the amplifier means is judged by the judgment means to exceed the threshold value,
    wherein the feedback resistance control means includes a shift register having one or more stages corresponding to the switches of the variable feedback resistance means, and
        wherein the data input terminal of the shift register is supplied with a constant voltage, and the clock terminals of the stages of the shift register are supplied with the output of the judgment means as a shift register clock signal, and
        wherein the data output terminals of the stages are connected to corresponding switches of the variable feedback resistance means respectively for supplying switch control signals to the switches.

5. The first stage amplifier circuit as claimed in claim 1, further comprising:
    a reset means for resetting the feedback resistance control means when the amplification of the input signal is completed.

6. The first stage amplifier circuit as claimed in claim 1, further comprising:
    a photoelectric transducer means for transducing a photo signal supplied thereto into photocurrent which changes corresponding to the change of the intensity of the photo signal and supplying the photocurrent to the amplifier means.

7. The first stage amplifier circuit as claimed in claim 6, wherein the photoelectric transducer means comprises a photodiode which is reversely biased.

8. The first stage amplifier circuit as claimed in claim 6, wherein the photoelectric transducer means receives a burst signal to which preamble bits have been attached, and the judgment means judges whether the output signal of the amplifier means corresponding to a bit "1" of the preamble bits exceeds the first predetermined threshold value.

9. The first stage amplifier circuit as claimed in claim 8, wherein a number of the switches of the variable feedback resistance means is set at N when a number of bits of the preamble bits is 2N.

10. The first stage amplifier circuit as claimed in claim 1, wherein the judgment means comprises a hysteresis comparator.

11. The first stage amplifier circuit as claimed in claim 6, wherein the photoelectric transducer means receives a burst signal to which preamble bits have been attached, and the judgment means judges whether the output signal of the amplifier means corresponding to a bit "0" of the preamble bits exceeds the second predetermined threshold value.

12. The first stage amplifier circuit as claimed in claim 1, wherein the judgment means judges whether the output signal of the amplifier means corresponding to a bit "1" and a bit "0" of preamble bits received in a burst signal exceed the first and second predetermined threshold values respectively.

13. The first stage amplifier circuit as claimed in claim 1, wherein the feedback resistance control means sets a feedback resistance of said amplifier on every reception of a burst signal.

14. The first stage amplifier circuit as claimed in claim 1, wherein a digitally detected intensity of preamble bits added to a front end of burst data is used to selectively control connections of the feedback resistors.

15. The first stage amplifier circuit as claimed in claim 1, wherein said amplifier means comprises an inversion amplifier.

16. The first stage amplifier circuit as claimed in claim 1, wherein said amplifier means comprises a non-inversion amplifier,
    wherein said judgment means comprises a comparator including a plurality of non-inverted input terminals, and
    wherein an inverter gate coupled to said non-inversion amplifier provides feedback.

17. The first stage amplifier circuit as claimed in claim 1, wherein the feedback resistance control means includes a shift register having one or more stages corresponding to the switches of the variable feedback resistance means, and
    wherein the data input terminal of the shift register is supplied with a constant voltage.

* * * * *